United States Patent
Zou et al.

(10) Patent No.: US 11,776,732 B2
(45) Date of Patent: Oct. 3, 2023

(54) COIL COMPONENT AND SWITCHING POWER SUPPLY DEVICE MOUNTED WITH COIL COMPONENT

(71) Applicant: TDK CORPORATION, Tokyo (JP)

(72) Inventors: Lian Wen Zou, Wuxi (CN); Qing Lu Qin, Wuxi (CN); Yi Xin Xu, Wuxi (CN)

(73) Assignee: TDK CORPORATION, Tokyo (JP)

( * ) Notice: Subject to any disclaimer, the term of this patent is extended or adjusted under 35 U.S.C. 154(b) by 195 days.

(21) Appl. No.: 17/406,993

(22) Filed: Aug. 19, 2021

(65) Prior Publication Data

US 2022/0059273 A1 Feb. 24, 2022

(30) Foreign Application Priority Data

Aug. 20, 2020 (CN) .......................... 202010841698.5

(51) Int. Cl.
| | |
|---|---|
| *H05K 7/20* | (2006.01) |
| *H01F 27/26* | (2006.01) |
| *H01F 27/28* | (2006.01) |
| *H01F 27/08* | (2006.01) |

(52) U.S. Cl.
CPC ........... *H01F 27/263* (2013.01); *H01F 27/08* (2013.01); *H01F 27/28* (2013.01); *H05K 7/209* (2013.01)

(58) Field of Classification Search
CPC ........ H01F 27/263; H01F 27/08; H01F 27/28; H05K 7/209
USPC ....................................................... 361/704
See application file for complete search history.

(56) References Cited

U.S. PATENT DOCUMENTS

| | | | | | |
|---|---|---|---|---|---|
| 5,361,242 | A | * | 11/1994 | Chaya ............... | G11B 11/10536 369/13.17 |
| 6,028,500 | A | * | 2/2000 | Buist ...................... | H05K 1/165 336/200 |
| 6,420,953 | B1 | * | 7/2002 | Dadafshar ........... | H01F 27/2852 336/200 |
| 6,504,463 | B1 | * | 1/2003 | Kato ..................... | H01F 27/027 336/200 |
| 6,628,531 | B2 | * | 9/2003 | Dadafshar .............. | H05K 1/165 336/200 |
| 6,774,755 | B2 | * | 8/2004 | Nakata .................... | H01F 37/00 336/200 |

(Continued)

FOREIGN PATENT DOCUMENTS

JP 2011-146530 A 7/2011

*Primary Examiner* — Anatoly Vortman
(74) *Attorney, Agent, or Firm* — Oliff PLC

(57) ABSTRACT

A coil component includes: first and second magnetic cores having first and second flat plate portions; a winding having a hollow core portion; first and second heat dissipation metal plates having first and second heat dissipation plane and first and second heat conduction portions, at least either one of the first and second flat plate portions has a middle leg, the middle leg is inserted into the hollow core portion of a winding, and the first magnetic core and the second magnetic core are combined in such a way that the first flat plate portion and the second flat plate portion face each other, the first heat dissipation plane portion is closely attached to the first flat plate portion and the second heat dissipation plane portion is closely attached to the second flat plate portion, the first heat conduction portion is connected to the second heat conduction portion.

20 Claims, 3 Drawing Sheets

(56) References Cited

U.S. PATENT DOCUMENTS

| | | | | |
|---|---|---|---|---|
| 7,986,208 B2* | 7/2011 | Yan | | H01F 27/292 336/192 |
| 8,089,331 B2* | 1/2012 | Jacobson | | H01F 27/2804 336/200 |
| 8,339,228 B2* | 12/2012 | Ishizawa | | H01F 17/043 336/232 |
| 8,378,777 B2* | 2/2013 | Yan | | H01F 17/0013 336/200 |
| 9,805,856 B2* | 10/2017 | Sasaki | | H01F 5/04 |
| 2006/0132275 A1* | 6/2006 | Pilniak | | H01F 27/325 336/208 |
| 2007/0109089 A1* | 5/2007 | Flanders | | H01F 21/08 336/220 |
| 2011/0273257 A1* | 11/2011 | Ishizawa | | H01F 17/043 336/192 |
| 2012/0044033 A1* | 2/2012 | Kawaguchi | | H01F 27/022 336/90 |
| 2013/0113592 A1* | 5/2013 | Yan | | H01F 27/2866 336/199 |
| 2014/0009251 A1* | 1/2014 | Hsu | | H01F 27/085 336/57 |
| 2014/0327505 A1* | 11/2014 | Schekulin | | H01F 41/04 336/55 |
| 2015/0348694 A1* | 12/2015 | Sakuma | | H02M 7/003 336/60 |
| 2016/0307684 A1* | 10/2016 | Takiguchi | | H01F 27/22 |
| 2017/0243688 A1* | 8/2017 | Kanazawa | | H01F 27/22 |
| 2017/0323718 A1* | 11/2017 | Foley | | H01F 27/2828 |
| 2018/0144858 A1* | 5/2018 | Oguchi | | H01F 27/2823 |
| 2020/0135379 A1* | 4/2020 | Lu | | H01F 27/306 |
| 2020/0286667 A1* | 9/2020 | Lai | | H01F 1/14708 |
| 2023/0121908 A1* | 4/2023 | Huang | | H01F 27/025 361/694 |

* cited by examiner

COIL COMPONENT AND SWITCHING POWER SUPPLY DEVICE MOUNTED WITH COIL COMPONENT

FIELD

The present invention relates to a coil component and a switching power supply device mounted with the coil component, and more particularly to a coil component provided with a heat dissipation structure and a switching power supply device mounted with the coil component.

BACKGROUND

A magnetic element such as a coil component having a core or the like is often used in a power supply device such as a switching power supply device or the like. The increase in the temperature of the magnetic element is an important concern in the design of the switching power supply device, and it is usually a bottleneck for improving the reliability of the product. When the coil component is used, the temperature of the magnetic element is rising due to the influence of the heat generated from the coil (copper loss) and the heat generated from the core (iron loss). As described above, it is required for magnetic elements such as coil components mounted in a switching power supply device to effectively dissipate heat generated from the coil or core and suppress the temperature rise of the magnetic element.

Therefore, as a magnetic component, for example, Patent Document 1 discloses an inductance element in which the heat generated from the edge-wound coil 3 is radiated via the upper core 5 and the lower core 7. In such an inductance element, the heat generated from the edge-wound coil 3 is accumulated in the core (upper core 5 and lower core 7). If the core rises to a certain temperature and becomes too high, the characteristics of the core will be deteriorated or even saturated. As a result, the inductance characteristics are lost.

CITATION LIST

Patent Document

Patent Document 1: JP2011-146530A

SUMMARY

The present invention was made in view of the above-mentioned problems, and its object is to provide a coil component with a heat dissipation structure having a high heat dissipation performance capable of suppressing the temperature rise of the core with a simple structure, and a switching power supply device mounted with the coil component.

In order to achieve the above-mentioned object, a coil component according to an aspect of the present invention is characterized by comprising: a first magnetic core having a first flat plate portion; a second magnetic core having a second flat plate portion; a winding having a hollow core portion; a first heat dissipation metal plate having a first heat dissipation plane portion and a first heat conduction portion; and a second heat dissipation metal plate having a second heat dissipation plane portion and a second heat conduction portion, at least either one of the first flat plate portion and the second flat plate portion has a middle leg, the middle leg is inserted into the hollow core portion, and the first magnetic core and the second magnetic core are combined in such a way that the first flat plate portion and the second flat plate portion face each other, the first heat dissipation plane portion is closely attached to the first flat plate portion and the second heat dissipation plane portion is closely attached to the second flat plate portion, the first heat conduction portion is connected to the second heat conduction portion.

In this way, the first heat dissipation metal plate having the first heat dissipation plane portion and the first heat conduction portion and the second heat dissipation metal plate having the second heat dissipation plane portion and the second heat conduction portion are respectively mounted on the first magnetic core and the second magnetic core, the end of the first heat dissipation metal plate (i.e., the first heat conduction portion) is connected to the end of the second heat dissipation metal plate (i.e., the second heat conduction portion), so that the first heat dissipation metal plate and the second heat dissipation metal plate are closely attached to the first magnetic core and the second magnetic core, respectively, thereby dissipating the heat of the first magnetic core and the second magnetic core to the first heat dissipation metal plate and the second heat dissipation metal plate. Further, the heat dissipated to the first heat dissipation metal plate and the second heat dissipation metal plate goes through the connection portion of the first heat conduction portion formed on the first heat dissipation metal plate and the second heat conduction portion formed on the second heat dissipation metal plate, the temperature difference between the first heat dissipation metal plate and the second heat dissipation metal plate is reduced, as a result, the temperature difference between the first magnetic core and the second magnetic core is also reduced. Such a heat dissipation structure can completely eliminate the gap between the heat dissipation metal plate and the plane of the magnetic core caused by the tolerance of the thickness of the magnetic core, and has a simple structure and high heat dissipation performance. Therefore, the temperature rise of the core can be effectively suppressed.

Furthermore, in the coil component according to an aspect of the present invention, it is preferable that at least either one of the first heat conduction portion and the second heat conduction portion has a notch portion, and the other heat conduction portion is connected to the notch portion by solder. This is to facilitate the solder connection between the first heat conduction portion and the second heat conduction portion.

Furthermore, in the coil component according to an aspect of the present invention, it is preferable that the first heat dissipation plane portion and the second heat dissipation plane portion are a line symmetrical polygon formed by four or more edges in a plan view, respectively, in the first heat dissipation plane portion, the first heat conduction portion is formed from two edges extending from both ends of one edge at one side of a gap for drawing out a lead-out portion of the winding among gaps formed by combining the first magnetic core and the second magnetic core, in the second heat dissipation plane portion, the second heat conduction portion is formed from two edges extending from both ends of one edge at the one side of the gap.

Furthermore, in the coil component according to an aspect of the present invention, it is preferable that the first heat dissipation plane portion and the second heat dissipation plane portion is a polygon formed by ten or more edges in a plan view, respectively, in the first heat dissipation plane portion, the first heat conduction portion is formed from at least two edges other than the two edges at one side of a gap for drawing out a lead-out portion of the winding among gaps formed by combining the first magnetic core and the second magnetic core, in the second heat dissipation plane portion, the second heat conduction portion is formed from at least two edges other than the two edges at the one side of the gap.

Furthermore, in the coil component according to an aspect of the present invention, it is preferable that the first heat dissipation metal plate and the second heat dissipation metal plate have the same shape. Thereby, it is possible to have a heat dissipation structure with high heat dissipation performance by using one type of heat dissipation metal plate.

A switching power supply device according to an aspect of the present invention is a switching power supply device having a heat dissipation member, and mounted with the above-mentioned coil component, the first heat dissipation plane portion or the second heat dissipation plane portion is thermally connected to the heat dissipation member. In this way, the heat is dissipated by thermally connecting the first heat dissipation metal plate or the second heat dissipation metal plate to the heat dissipation member. Therefore, the temperature rise of the magnetic core can be further effectively suppressed.

Furthermore, in the switching power supply device according to an aspect of the present invention, it is preferable that the heat dissipation member is a metal substrate such as an aluminum substrate or the like.

According to the present invention, it is possible to provide a coil component with a heat dissipation structure having a high heat dissipation performance capable of suppressing the temperature rise of the core with a simple structure, and a switching power supply device mounted with the coil component.

DETAILED DESCRIPTION OF THE EMBODIMENT(S)

Figure 1:
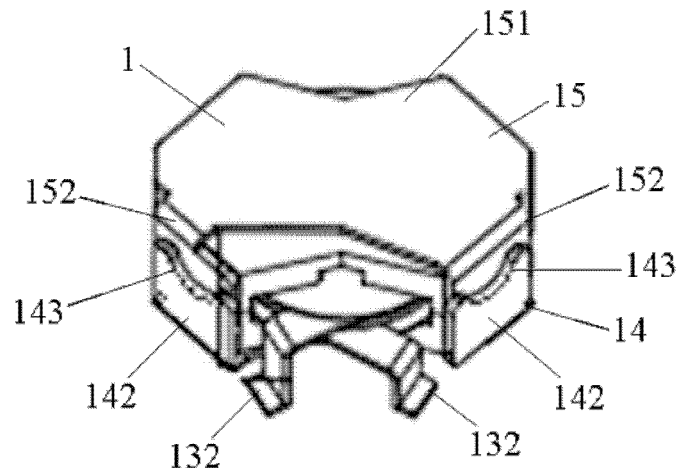
FIG. 1 is a perspective view showing a schematic structure of a coil component according to the present embodiment.

Hereinafter, preferred embodiments of the present invention will be described in detail with reference to the accompanying drawings. Here, in the description of the drawings, the same reference numerals denote the same or equivalent elements, duplicated descriptions thereof will be omitted.

The switching power supply device according to the present embodiment includes a heat dissipation member and a coil component 1, and the coil component 1 is mounted on the heat dissipation member.

In the present embodiment, for example, the heat dissipation member is a metal substrate such as an aluminum substrate or the like. Thereby, the heat dissipation member can be easily constructed. However, the heat dissipation member is not limited to a metal substrate such as an aluminum substrate or the like, and it may be provided as a substrate of any material as long as it is a material with excellent heat dissipation performance.

Figure 2:
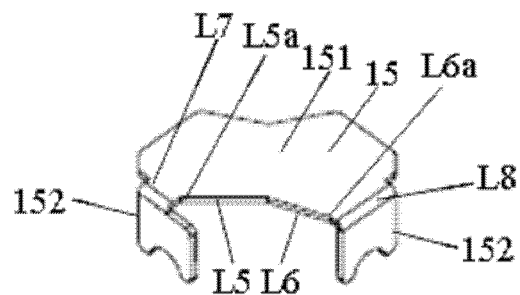
FIG. 2 is an exploded perspective view showing a schematic structure of a coil component and a heat dissipation metal plate according to the present embodiment.
Figure 2:
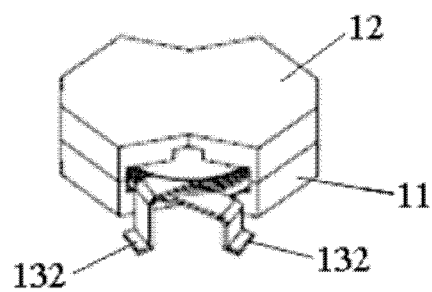
Figure 2:
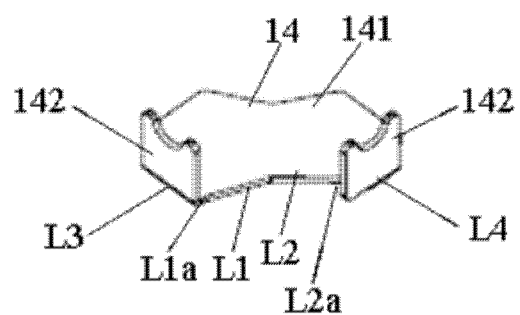
Figure 3:
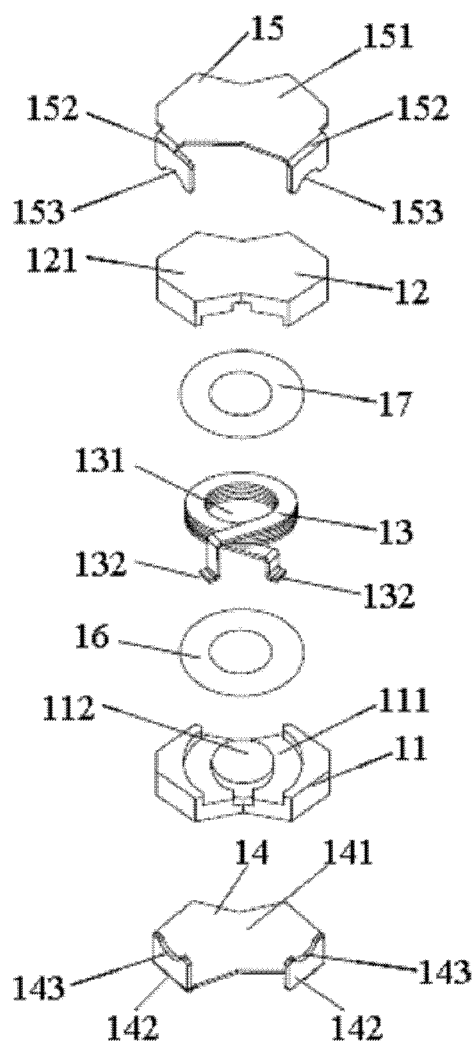
FIG. 3 is an exploded perspective view showing a schematic structure of the core, the coil, the spacer, and the heat dissipation metal plate of the coil component according to the present embodiment.

FIG. 1 is a perspective view showing a schematic structure of a coil component according to the present embodiment. FIG. 2 is an exploded perspective view showing a schematic structure of a coil component and a heat dissipation metal plate according to the present embodiment. FIG. 3 is an exploded perspective view showing a schematic structure of the core, the coil, the spacer, and the heat dissipation metal plate of the coil component according to the present embodiment.

As shown in FIGS. 1 to 3, the coil component 1 comprises a first magnetic core 11 including a first flat plate portion 111 having a middle leg 112; a second magnetic core 12 including a second flat plate portion 121; a winding 13 having an hollow core portion 131; a first heat dissipation metal plate 14 having a first heat dissipation plane portion 141 and a first heat conduction portion 142; and a second heat dissipation metal plate 15 having a second heat dissipation plane portion 151 and a second heat conduction portion 152. The coil component 1 is suitably used as a magnetic component.

Although not shown in FIGS. 1 to 3, not only a middle leg is formed in the first flat plate portion 111 but also a middle leg is formed in the second flat plate portion 121.

Furthermore, it may be a structure in which the midfoot is formed only in the first flat plate portion or a structure in which the midfoot is formed only in the second flat plate portion.

Furthermore, the core of the coil component 1, that is, at least either one of the first flat plate portion and the second flat plate portion may have a middle leg.

As shown in FIGS. 1 to 3, outer legs are formed at both ends of the first flat plate portion 111 and the second flat plate portion 121, respectively.

Furthermore, it is also possible to provide a structure in which outer legs are formed only at both ends of either one of the first flat plate portion 111 and the second flat plate portion 121.

Note that the first magnetic core 11 and the second magnetic core 12 are made of a magnetic material such as ferrite or the like.

The middle leg 112 of the first magnetic core 11 is inserted into the hollow core portion 131 located approximately in the center of the winding 13, and the first magnetic core 11 and the second magnetic core 12 are combined in such a way that the first flat plate portion 111 and the second flat plate portion 121 face each other (although not shown, the middle leg of the second magnetic core 12 is also inserted into the hollow core portion 131). Thus, a structure is formed in which the winding 13 is sandwiched by the first magnetic core 11 and the second magnetic core 12 via the spacers 16, 17, respectively. Here, the spacers 16 and 17 function as spacers for insulation and/or as spacers for absorbing dimensional tolerances of the core or winding.

The winding 13 includes two lead-out portions 132. The two lead-out portions 132 are drawn to the outside from the end of the winding 13 through a gap formed by the first flat plate portion 111, the second flat plate portion 121 and the outer leg by combining the first magnetic core 11 and the second magnetic core 12.

The first heat dissipation plane portion 141 and the first flat plate portion 111 are closely attached to each other, the second heat dissipation plane portion 151 and the second flat plate portion 121 are closely attached to each other, so that the first heat dissipation plane portion 141 and the first flat plate portion 111 are thermally connected, and the second heat dissipation plane portion 151 and the second flat plate portion 121 are thermally connected. Thereby, the heat generated in the first magnetic core 11 can be easily conducted to the first heat dissipation metal plate 14 and the heat generated in the second magnetic core 12 can be easily conducted to the second heat dissipation metal plate 15. Also, in order to efficiently conduct the heat generated in the magnetic core to the heat dissipation metal plate, it is preferable that the first heat dissipation metal plate 14 and the second heat dissipation metal plate 15 are each made of a material having good heat dissipation properties such as metal.

Furthermore, it can also be provided as a structure in which the first heat dissipation plane portion 141 and the first flat plate portion 111 are closely attached to each other by filling high thermal conductivity silicone resin or other high thermal conductivity material between the first heat dissipation plane portion 141 and the first flat plate portion 111, the second heat dissipation plane portion 151 and the second flat plate portion 121 are closely attached to each other by filling high thermal conductivity silicone resin or other high thermal conductivity material between the second heat dissipation plane portion 151 and the second flat plate portion 121.

The first heat conduction portion 142 and the second heat conduction portion 152 are connected to each other. Specifically, the inner surface of the first heat conduction portion 142 and the outer surface of the second heat conduction portion 152 are in contact with each other.

In the present embodiment, the first heat conduction portion 142 and the second heat conduction portion 152 are in contact with each other in the entire width direction. However, it is also possible to provide a structure in which the first heat conduction portion 142 and the second heat conduction portion 152 are in contact with each other in a part of the width direction.

Furthermore, the outer surface of the first heat conduction portion 142 and the inner surface of the second heat conduction portion 152 may be in contact with each other.

Furthermore, the first heat dissipation plane portion 141 and the second heat dissipation plane portion 151 may have a plurality of heat conduction portions, respectively, the inner surface of at least one first heat conduction portion 142 and the outer surface of one second heat conduction portion 152 are in contact with each other, the outer surface of at least the other first heat conduction portion 142 and the inner surface of the other second heat conduction portion 152 are in contact with each other.

In this way, the first heat dissipation metal plate having the first heat dissipation plane portion and the first heat conduction portion and the second heat dissipation metal plate having the second heat dissipation plane portion and the second heat conduction portion are respectively mounted on the first magnetic core and the second magnetic core, the end of the first heat dissipation metal plate (i.e., the first heat conduction portion) is connected to the end of the second heat dissipation metal plate (i.e., the second heat conduction portion), so that the first heat dissipation metal plate and the second heat dissipation metal plate are closely attached to the first magnetic core and the second magnetic core, respectively, thereby dissipating the heat of the first magnetic core and the second magnetic core to the first heat dissipation metal plate and the second heat dissipation metal plate. Further, the heat dissipated to the first heat dissipation metal plate and the second heat dissipation metal plate goes through the connection portion of the first heat conduction portion formed on the first heat dissipation metal plate and the second heat conduction portion formed on the second heat dissipation metal plate, the temperature difference between the first heat dissipation metal plate and the second heat dissipation metal plate is reduced, as a result, the temperature difference between the first magnetic core and the second magnetic core is also reduced. Such a heat dissipation structure can completely eliminate the gap between the heat dissipation metal plate and the plane of the magnetic core caused by the tolerance of the thickness of the magnetic core, and has a simple structure and high heat dissipation performance. Therefore, the temperature rise of the core can be effectively suppressed.

Furthermore, in the present embodiment, the first heat conduction portion 142 has a substantially U-shaped notch portion 143, and the second heat conduction portion 152 has a substantially U-shaped notch portion 153, the inner surface of the first heat conduction portion 142 and the outer surface of the second heat conduction portion 152 are in contact with each other, the second heat conduction portion 152 and the notch portion 143 are connected by solder. This is to facilitate the solder connection between the first heat conduction portion and the second heat conduction portion.

Furthermore, in the structure in which the outer surface of the first heat conduction portion 142 and the inner surface of the second heat conduction portion 152 are in contact with each other, the first heat conduction portion 142 and the notch portion 153 are connected by solder.

Furthermore, in the present embodiment, the explanation is given by taking as an example the notch portions provided on both the first heat conduction portion and the second heat conduction portion. However, it is possible that either one of the first heat conduction portion and the second heat conduction portion has a notch portion, and the other one is connected to the notch portion by solder. Furthermore, the shape of the notch portion is not limited to a substantially U-shape, and various shapes such as a substantially semicircular shape, a rectangle with an opened side, and a substantially V-shape may be used.

In the present embodiment, the first heat dissipation plane portion 141 and the second heat dissipation plane portion 151 are constituted by a decagon formed by ten edges in a plan view, respectively. That is, the first heat dissipation plane portion 141 and the second heat dissipation plane portion 151 include ten edges, respectively. However, the shapes of the first heat dissipation plane portion 141 and the second heat dissipation plane portion 151 are not limited thereto, and the first heat dissipation plane portion 141 and the second heat dissipation plane portion 151 may be provided as a polygon formed by 11 or more edges in a plan view, respectively.

In the ten edges of the first heat dissipation plane portion 141, two first heat conduction portions 142 are respectively formed from the edges L3, L4, the edges L3, L4 are formed by extending from the ends L1a, L2a of the two edges L1, L2 at one side of a gap for drawing out the lead-out portion 132 of the winding 13 among gaps formed by combining the first magnetic core and the second magnetic core, the ends L1a, L2a are respectively at the opposite side to the contact point of the two edges L1, L2. Similarly, in the ten edges of the second heat dissipation plane portion 151, two first heat conduction portions 152 are respectively formed from the edges L7, L8, the edges L7, L8 are formed by extending from the ends L5a, L6a of the two edges L5, L6 at one side of a gap for drawing out the lead-out portion 132 of the winding 13 among gaps formed by combining the first magnetic core and the second magnetic core, the ends L5a, L6a are respectively at the opposite side to the contact point of the two edges L5, L6. That is, the first heat conduction portion 142 extends from the edges L3, L4 of the ten edges of the first heat dissipation plane portion 141 in a direction substantially perpendicular to the first heat dissipation plane portion 141 (in FIG. 1, it is shown in an upward direction). The second heat conduction portion 152 extends from the edges L7, L8 of the ten edges of the second heat dissipation plane portion 151 in a direction substantially perpendicular to the second heat dissipation plane portion 151 (in FIG. 1, it is shown in a downward direction). In this way, in the coil component 1, the first heat conduction portion 142 and the second heat conduction portion 152 are closely attached to each other so as to overlap each other. Furthermore, the first heat conduction portion 142 is formed from the edge of the first heat dissipation plane portion 141 adjacent to the edge at one side of a gap for drawing out the lead-out portion 132 of the winding 13 among gaps formed by combining the first magnetic core and the second magnetic core, the second heat conduction portion 152 is formed from the edge of the second heat dissipation plane portion 151 adjacent to the edge at one side of a gap for drawing out the lead-out portion 132 of the winding 13 among gaps formed by combining the first magnetic core and the second magnetic core. Therefore, the lead-out portion 132 of the winding 13 is not obstructed by the first heat conduction portion 142 and the second heat conduction portion 152 and is drawn out.

Furthermore, as long as the first heat conduction portion 142 and the second heat conduction portion 152 can be closely attached to each other in an overlapping manner, the first heat conduction portion 142 may be formed from any two or more edges of the eight edges among the ten edges of the first heat dissipation plane portion 141 other than the two edges L1, L2 at one side of a gap for drawing out the lead-out portion 132 of the winding 13 among gaps formed by combining the first magnetic core and the second magnetic core. Similarly, the second heat conduction portion 152 may be formed from any two or more edges of the eight edges among the ten edges of the second heat dissipation plane portion 151 other than the two edges L5, L6 at one side of a gap for drawing out the lead-out portion 132 of the winding 13 among gaps formed by combining the first magnetic core and the second magnetic core.

In the present embodiment, the first heat dissipation metal plate 14 and the second heat dissipation metal plate 15 have the same shape. However, it is not limited thereto, in the coil component 1, as long as the first heat conduction portion 142 extending from the edge of the first heat dissipation plane portion 141 and the second heat conduction portion 152 extending from the edge of the second heat dissipation plane portion 151 can be brought into surface contact with each other, the first heat dissipation metal plate 14 and the second heat dissipation metal plate 15 may have different shapes.

In the present embodiment, the first heat dissipation plane portion 141 is thermally connected to the heat dissipation member. However, it is not limited thereto, and the second heat dissipation plane portion 151 may be thermally connected to the heat dissipation member. In this way, the first heat dissipation plane portion 141 or the second heat dissipation plane portion 151 is thermally connected to the heat dissipation member for heat dissipation. Therefore, the temperature rise of the magnetic core can be further suppressed.

Furthermore, it may be configured as a structure in which the first heat dissipation plane portion 141 or the second heat dissipation plane portion 151 is connected to a heat dissipation member such as a metal substrate through a high thermal conductivity material, or may be a structure in which the first heat dissipation plane portion 141 or the second heat dissipation plane portion 151 is directly welded to a heat dissipation member such as a metal substrate.

Figure 4:
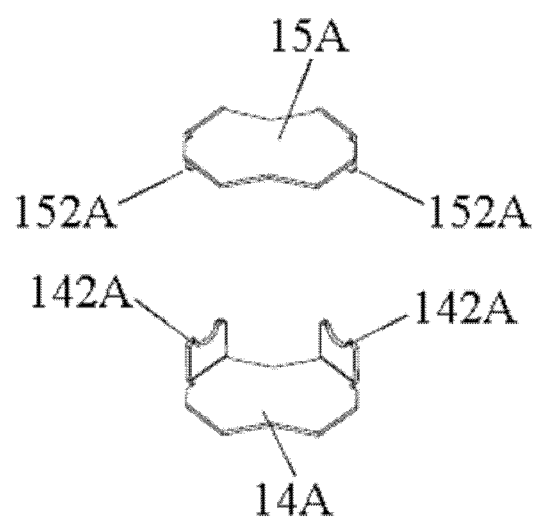
FIG. 4 is a perspective view showing a schematic structure of a first heat dissipation metal plate and a second heat dissipation metal plate of a first modification of the coil component according to the present embodiment.

FIG. 4 is a perspective view showing a schematic structure of a first heat dissipation metal plate and a second heat dissipation metal plate of a first modification of the coil component according to the present embodiment. As shown in FIG. 4, the first heat dissipation metal plate 14A according to the modification includes a first heat conduction portion 142A, and the second heat dissipation metal plate 15A includes a second heat conduction portion 152A.

Figure 5:
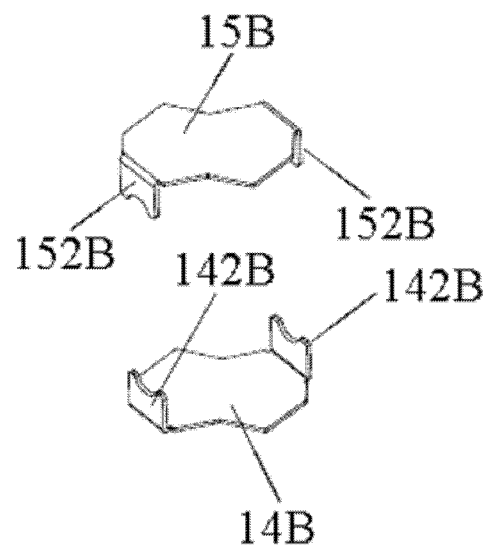
FIG. 5 is a perspective view showing a schematic structure of a first heat dissipation metal plate and a second heat dissipation metal plate of a second modification of the coil component according to the present embodiment.

FIG. 5 is a perspective view showing a schematic structure of a first heat dissipation metal plate and a second heat dissipation metal plate of a second modification of the coil component according to the present embodiment. As shown in FIG. 5, the first heat dissipation metal plate 14B according to the modification includes a first heat conduction portion 142B, and the second heat dissipation metal plate 15B includes a second heat conduction portion 152B.

Figure 6:
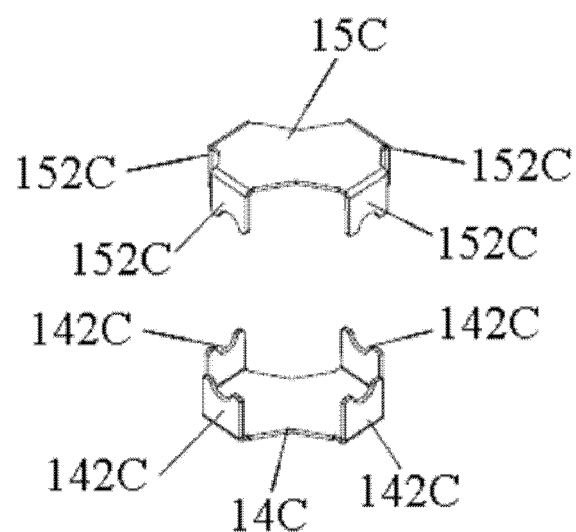
FIG. 6 is a perspective view showing a schematic structure of a first heat dissipation metal plate and a second heat dissipation metal plate of a third modification of the coil component according to the present embodiment.

FIG. 6 is a perspective view showing a schematic structure of a first heat dissipation metal plate and a second heat dissipation metal plate of a third modification of the coil component according to the present embodiment. As shown in FIG. 6, the first heat dissipating metal plate 14C according to the modification includes a first heat conduction portion 142C, and the second heat dissipation metal plate 15C includes a second heat conduction portion 152C.

The preferred embodiments of the present invention have been described above, but various changes and modifications can be made without departing from the gist of the present invention. For example, in the above-mentioned embodiment, the first heat dissipation plane portion 141 and the second heat dissipation plane portion 151 are constituted by a decagon formed by ten edges in a plan view, respectively. However, the first heat dissipation plane portion and the second heat dissipation plane portion may be a line symmetrical polygon formed by four or more edges in a plan view, respectively. In this case, in the four or more edges of the first heat dissipation plane portion, the first heat conduction portion is formed from two edges extending from both ends of one edge which is at least at one side of a gap for drawing out the lead-out portion of the winding among gaps formed by combining the first magnetic core and the second magnetic core, in the four or more edges of the second heat dissipation plane portion, the second heat conduction portion is formed from two edges extending from both ends of one edge which is at least at one side of a gap for drawing out the lead-out portion of the winding among gaps formed by combining the first magnetic core and the second magnetic core.

Furthermore, the present invention is suitably used as a coil component and a switching power supply device mounted with the coil component, but it can also be used as a magnetic component other than the coil component and a device mounted with the magnetic component.

The invention claimed is:

1. A coil component, comprising:
a first magnetic core having a first flat plate portion;
a second magnetic core having a second flat plate portion, the first magnetic core and the second magnetic core being combined such that the first flat plate portion and the second flat plate portion face each other;
a winding having a hollow core portion;
a first heat dissipation metal plate having:
a first heat dissipation plane portion directly physically attached to the first flat plate portion; and
a first heat conduction portion;
a second heat dissipation metal plate having:
a second heat dissipation plane portion directly physically attached to the second flat plate portion; and
a second heat conduction portion directly physically connected to the first heat conduction portion; and
a middle leg of at least one of the first flat plate portion and the second flat plate portion, the middle leg being disposed in the hollow core portion.

2. The coil component according to claim 1, wherein at least one of the first heat conduction portion and the second heat conduction portion has a notch portion, and the other one is directly physically connected to the notch portion by solder.

3. The coil component according to claim 1, wherein the first heat dissipation plane portion and the second heat dissipation plane portion are a line symmetrical polygon formed by four or more edges in a plan view, respectively, in the first heat dissipation plane portion, the first heat conduction portion is formed from two edges extending from both ends of one edge at one side of a gap for drawing out a lead-out portion of the winding among gaps formed by combining the first magnetic core and the second magnetic core, in the second heat dissipation plane portion, the second heat conduction portion is formed from two edges extending from both ends of one edge at the one side of the gap.

4. The coil component according to claim 2, wherein the first heat dissipation plane portion and the second heat dissipation plane portion are a line symmetrical polygon formed by four or more edges in a plan view, respectively, in the first heat dissipation plane portion, the first heat conduction portion is formed from two edges extending from both ends of one edge at one side of a gap for drawing out a lead-out portion of the winding among gaps formed by combining the first magnetic core and the second magnetic core, in the second heat dissipation plane portion, the second heat conduction portion is formed from two edges extending from both ends of one edge at the one side of the gap.

5. The coil component according to claim 1, wherein the first heat dissipation plane portion and the second heat dissipation plane portion are a polygon formed by ten or more edges in a plan view, respectively, in the first heat dissipation plane portion, the first heat conduction portion is formed from at least two edges other than two edges at one side of a gap for drawing out a lead-out portion of the winding among gaps formed by combining the first magnetic core and the second magnetic core, in the second heat dissipation plane portion, the second heat conduction portion is formed from at least two edges other than two edges at the one side of the gap.

6. The coil component according to claim 2, wherein the first heat dissipation plane portion and the second heat dissipation plane portion are a polygon formed by ten or more edges in a plan view, respectively, in the first heat dissipation plane portion, the first heat conduction portion is formed from at least two edges other than two edges at one side of a gap for drawing out a lead-out portion of the winding among gaps formed by combining the first magnetic core and the second magnetic core, in the second heat dissipation plane portion, the second heat conduction portion is formed from at least two edges other than two edges at the one side of the gap.

7. The coil component according to claim 1, wherein the first heat dissipation metal plate and the second heat dissipation metal plate have the same shape.

8. The coil component according to claim 2, wherein the first heat dissipation metal plate and the second heat dissipation metal plate have the same shape.

9. The coil component according to claim 3, wherein the first heat dissipation metal plate and the second heat dissipation metal plate have the same shape.

10. The coil component according to claim 4, wherein the first heat dissipation metal plate and the second heat dissipation metal plate have the same shape.

11. The coil component according to claim 5, wherein the first heat dissipation metal plate and the second heat dissipation metal plate have the same shape.

12. The coil component according to claim 6, wherein the first heat dissipation metal plate and the second heat dissipation metal plate have the same shape.

13. The coil component according to claim 1, wherein the coil component is configured to be mounted to a switching power supply device having a heat dissipation member with the first heat dissipation plane portion or the second heat dissipation plane portion thermally connected to the heat dissipation member.

14. The coil component according to claim 2, wherein the coil component is configured to be mounted to a switching power supply device having a heat dissipation member with the first heat dissipation plane portion or the second heat dissipation plane portion thermally connected to the heat dissipation member.

15. The coil component according to claim 3, wherein the coil component is configured to be mounted to a switching power supply device having a heat dissipation member with the first heat dissipation plane portion or the second heat dissipation plane portion thermally connected to the heat dissipation member.

16. The coil component according to claim 4, wherein the coil component is configured to be mounted to a switching power supply device having a heat dissipation member with the first heat dissipation plane portion or the second heat dissipation plane portion thermally connected to the heat dissipation member.

17. The coil component according to claim 5, wherein the coil component is configured to be mounted to a switching power supply device having a heat dissipation member with the first heat dissipation plane portion or the second heat dissipation plane portion thermally connected to the heat dissipation member.

18. The coil component according to claim 6, wherein the coil component is configured to be mounted to a switching power supply device having a heat dissipation member with the first heat dissipation plane portion or the second heat dissipation plane portion thermally connected to the heat dissipation member.

19. The coil component according to claim 7, wherein the coil component is configured to be mounted to a switching power supply device having a heat dissipation member with the first heat dissipation plane portion or the second heat dissipation plane portion thermally connected to the heat dissipation member.

20. The coil component according to claim 13, wherein the heat dissipation member is an aluminum substrate.

\* \* \* \* \*